(12) United States Patent
Licht (10) Patent No.: US 7,120,579 B1
(45) Date of Patent: Oct. 10, 2006

(54) FILTER BANKED GAIN CONTROL OF AUDIO IN A NOISY ENVIRONMENT

(75) Inventor: Zvi (Tsvika) Licht, Givat-Shmuel (IL)

(73) Assignee: Clear Audio Ltd., Givat-Shmuel (IL)

( * ) Notice: Subject to any disclaimer, the term of this patent is extended or adjusted under 35 U.S.C. 154(b) by 893 days.

(21) Appl. No.: 10/048,328

(22) PCT Filed: Jul. 27, 2000

(86) PCT No.: PCT/US00/20395

§ 371 (c)(1),
(2), (4) Date: Jan. 24, 2002

(87) PCT Pub. No.: WO01/10020

PCT Pub. Date: Feb. 8, 2001

Related U.S. Application Data (60) Provisional application No. 60/145,936, filed on Jul. 28, 1999.

(51) Int. Cl.
*G10L 19/02* (2006.01)

(52) U.S. Cl. ............ 704/225; 704/226; 704/229

(58) Field of Classification Search ............ 704/225, 704/226, 229
See application file for complete search history.

(56) References Cited

U.S. PATENT DOCUMENTS

| | | | |
|---|---|---|---|
| 4,381,488 A | 4/1983 | Fricke et al. | |
| 4,468,804 A | 8/1984 | Kates et al. | |
| 4,476,571 A | 10/1984 | Tokumo et al. | |
| 4,630,302 A | 12/1986 | Kryter et al. | |
| 4,829,565 A | 5/1989 | Goldberg | |
| 4,868,881 A | 9/1989 | Zwicker et al. | |
| 5,450,494 A | 9/1995 | Okubo et al. | |
| 5,524,148 A | 6/1996 | Allen et al. | |
| 5,526,419 A | 6/1996 | Allen et al. | |

(Continued)

FOREIGN PATENT DOCUMENTS

EP 0 856 833 8/1998

(Continued)

OTHER PUBLICATIONS

Zwicker et al. "Psychoacoustics Facts and Models" Springer-Verlag, Berlin, Apr. 14, 1999, pp. 61-71.*

(Continued)

*Primary Examiner*—V. Paul Harper
(74) *Attorney, Agent, or Firm*—Fenster & Co.

(57) ABSTRACT

A method and device for boosting an input signal to overcome noise. Both the input signal, S(t), and an estimate of the noise, N(t), are bandpassed in adjacent pass bands to produce signal and noise subbands. Preferably, the input signal is delayed before being bandpassed. The power envelopes of the signal subbands are converted to signal masking functions, (70), that incorporate the phenomena of forward and backward masking. Signal masking functions whose amplitudes are below the amplitudes of their frequency neighbors are nulled. Similarly, noise subbands whose powers are below the powers of neighboring noise subbands are nulled. The surviving signal masking functions are compared to the corresponding surviving noise power envelopes to determine the degree to which the surviving signal subbands must be amplified, (78), to overcome the noise. The surviving signal subbands are so amplified and summed to provide the output signal, S'(t). Because of wide band masking, this processing by subbands is inhibited during the onset of incoming signal. Similarly, in a two-way communications device, this processing by subbands is inhibited while the user is speaking.

35 Claims, 8 Drawing Sheets

U.S. PATENT DOCUMENTS

| | | | |
|---|---|---|---|
| 5,550,924 | A | 8/1996 | Helf et al. |
| 5,615,270 | A | 3/1997 | Miller et al. |
| 5,636,272 | A | 6/1997 | Rasmusson |
| 5,737,721 | A | 4/1998 | Kwon |
| 6,035,048 | A * | 3/2000 | Diethorn .................... 381/94.3 |
| 6,141,415 | A | 10/2000 | Rao |
| 6,766,292 | B1 | 7/2004 | Chandran et al. |

FOREIGN PATENT DOCUMENTS

| | | |
|---|---|---|
| JP | 07 066651 | 3/1995 |
| JP | 07 307632 | 11/1995 |
| WO | WO 99/01863 | 1/1999 |

OTHER PUBLICATIONS

Brandenburg, K. et al.; "Overview of MPEG Audio: Current and Future Standards for Low-Bit-Rate Audio Coding"; J. Audio Eng. Soc., vol. 45, No. ½; 1997; pp. 4-21.

Brandenburg, K. et al.; "ISO-MPEG-1 Audio: Generic Standard for Coding of High-Quality Digital Audio"; J. Audio Eng. Soc., vol. 42, No. 10; 1994; pp. 780-792.

Yoo, C. D.; "Utilizing Interband Acoustical Information for Modeling Stationary Time-Frequency Regions of Noisy Speech;" Mar. 1999; pp. 809-812; IEEE International Conference on Acoustics, Speech and Signal Processing; vol. 2.

Yoshihisa, N.; Patent Abstracts of Japan; vol. 1997; No. 9, Sep. 30, 1997; & JP 09 116362; May 2, 1997.

Zwicker, E. et al.; Psychoacoustics, Facts and Models; Springer; Second updated edition; 1999; pp. 74-84.

* cited by examiner

FILTER BANKED GAIN CONTROL OF AUDIO IN A NOISY ENVIRONMENT

RELATED APPLICATIONS

This application is a U.S. national filing of PCT Application No. PCT/US00/20395, filed Jul. 27, 2000, and claims the benefit under 119(e) of U.S. provisional application 60/145,936 filed 28 Jul. 1999.

FIELD AND BACKGROUND OF THE INVENTION

The present invention relates to speech communication and devices for the same and, more particularly, to a method and system for clarifying acoustical speech and acoustical audio in noisy environments.

Communications devices commonly are used in noisy environments. One common example of the use of such a device in such an environment is the use of a cellular telephone inside a vehicle such as an automobile. The noises in this environment include both the noise of the vehicle itself, for example, the noise of the vehicle's engine; noise, such as wind noise, resulting from the movement of the vehicle; and noise received from other vehicles.

In the case of rhythmic noise, it is known to generate a cancellation signal approximately equal in amplitude and opposite in phase to the noise. This cancellation signal is added to the noise to largely cancel the noise.

In the case of a one-way communications device, such as a car radio, the simplest way to overcome environmental noise is to simply raise the volume, i.e., increase the power of the received signal so that the received signal overwhelms the noise. A variety of methods are known for doing this automatically. Tokumo et al., in U.S. Pat. No. 4,476,571, teach an automatic sound control device for a car stereo. Ambient noise is low-pass and bandpass filtered before being used as a control signal for automatic volume control, to make sure that "noise" in the speech frequency band is ignored, so that the device does not drown out speech along with true ambient noise. Zwicker et al., in U.S. Pat. No. 4,868,881, teach the spectral decomposition of both a car radio signal and an ambient noise signal into three frequency subbands. The envelopes of the signals in the three subbands are delayed, smoothed and compared. On the basis of the comparison, each subband of the radio signal is amplified to overcome the corresponding noise subband.

These prior art methods ignore certain psychoacoustic phenomena associated with the human perception of audible signals, as described, for example, in E. Zwicker and H. Fastl, *Psychoacoustics, Facts and Models*, Springer, second updated edition (1999), pp. 74–84.

One such phenomenon is frequency masking. If an acoustic signal includes two similar frequency components, and the amplitude of one frequency component is significantly greater than the amplitude of the other frequency component, then the listener perceives only the stronger of the two frequency components.

Figure 1:
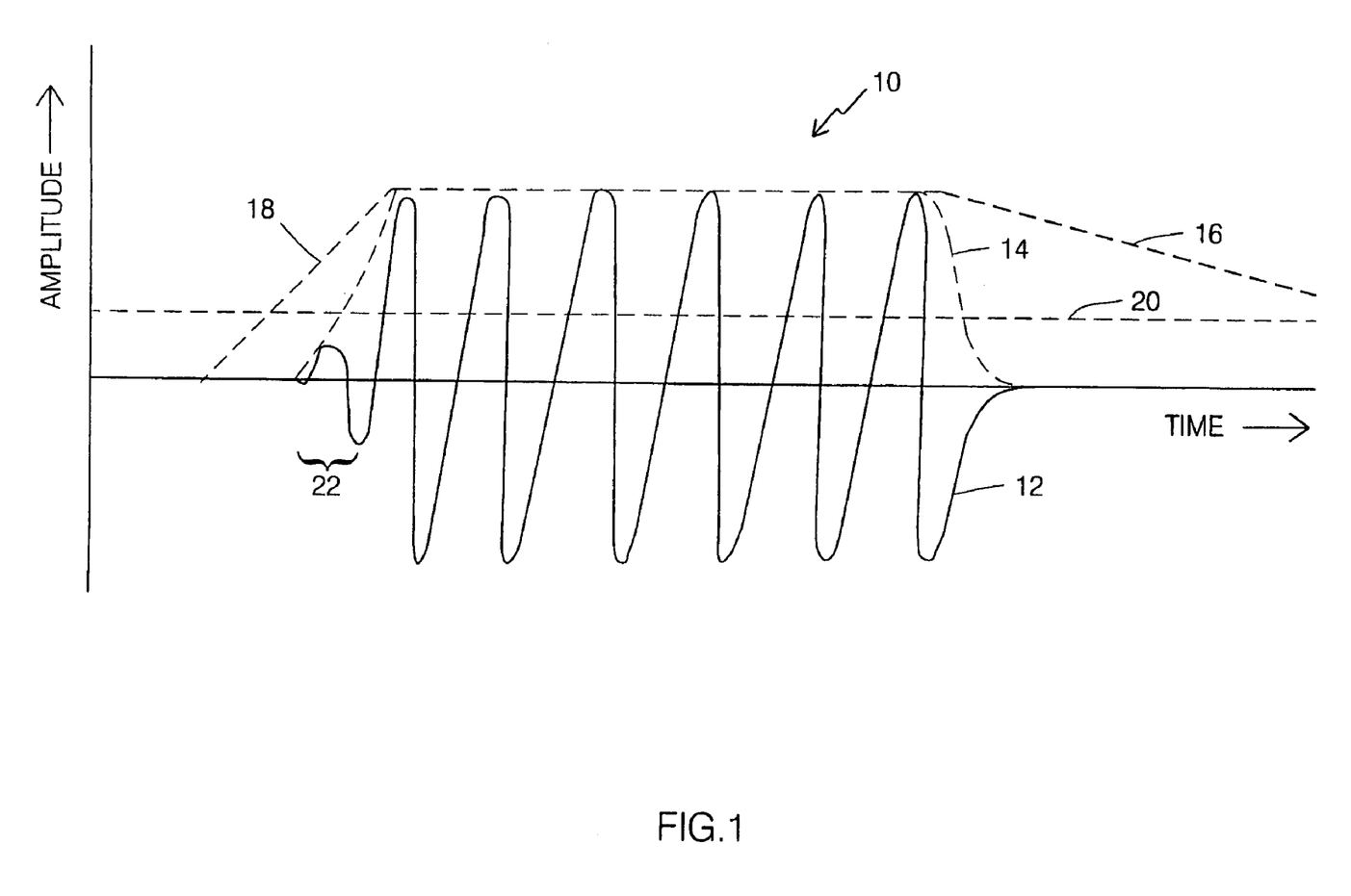
FIG. 1 illustrates time masking.

Another such phenomenon is time masking. This phenomenon is illustrated in FIG. 1, which shows the amplitude waveform 12 and the amplitude envelope 14 of a short, high-frequency whistle 10 as a function of time. Also shown in FIG. 1 are a forward time masking extension 16, a backward time masking extension 18 of envelope 14, and an amplitude level 20 of ambient noise which may be white noise or which may be single frequency noise at a frequency close to the frequency of whistle 10. A listener who pays attention to whistle 10 will also perceive a subsequent whistle of similar spectral properties until forward time masking extension 16 falls below level 20 of the ambient noise, even if the amplitude envelope of the subsequent whistle is below level 20 of the ambient noise. Furthermore, the listener also perceives all of a precursor 22 of whistle 10, even though envelope 14 is below ambient noise amplitude level 20 for much of the duration of precursor 22, because backward time masking extension 18 is above ambient noise amplitude level 20 for the duration of precursor 22. Backward time masking is believed to reflect retroactive processing of the signal received by the listener, to recover precursor 22 from the ambient noise. The duration of forward time masking is on the order of about 200 milliseconds. The duration of backward time masking is on the order of about 5 to 50 milliseconds.

A third such phenomenon is wide band masking, in which a burst of signal temporarily masks ambient noise.

Many communications devices, such as hand-held cellular telephones, are small and lightweight, and therefore place a premium on low power consumption. Therefore, there is thus a widely recognized need for, and it would be highly advantageous to have, methods and associated communications devices that exploit psychoacoustic phenomena to reduce the power consumed in the boosting of an incoming signal over ambient noise.

SUMMARY OF THE INVENTION

According to the present invention there is provided a method of boosting an input signal to overcome a noise, including the steps of: (a) estimating the noise, thereby providing an estimated noise; (b) bandpassing the input signal in a plurality of adjacent pass bands to obtain a corresponding plurality of signal subbands; (c) bandpassing the estimated noise in the plurality of adjacent pass bands to obtain a corresponding plurality of noise subbands; and (d) for each signal subband: (i) obtaining a power measure of the each signal subband, (ii) comparing the power measure of the each signal subband to the power measure of at least one other signal subband, (iii) whenever the power measure of the at least one other signal subband exceeds the power measure of the each signal subband by a signal masking threshold, nulling the each signal subband, (iv) otherwise, adjusting the each signal subband so that the each signal subband masks a corresponding noise subband.

According to the present invention there is provided an apparatus for converting an input signal to an output signal that is distinguishable from a noise, including: (a) a mechanism for estimating the noise, thereby providing an estimated noise; (b) a plurality of signal bandpass filters for decomposing the input signal into a plurality of adjacent signal subbands; (c) for each signal bandpass filter, a corresponding noise bandpass filter, the noise bandpass filters for decomposing the estimated noise into a plurality of adjacent noise subbands corresponding to the signal subbands; (d) a mechanism for obtaining a power measure of each signal subband, for comparing the power measure of the each signal subband to the power measure of at least one other the signal subband, and for nulling the each signal subband whenever the power measure of the at least one other the signal subband exceeds the power measure of the each signal subband by a signal masking threshold; and (e) for each signal subband, a mechanism for adjusting the each signal subband to mask a corresponding noise subband.

According to the present invention there is provided in a communications system wherein a user alternately receives a received signal in a noisy environment and transmits a transmitted signal, a method for boosting the received signal to overcome the noise, including the steps of: (a) estimating the noise, thereby providing an estimated noise; (b) bandpassing the received signal in a plurality of adjacent pass bands to obtain a corresponding plurality of signal subbands; (c) bandpassing the estimated noise in the plurality of adjacent pass bands to obtain a corresponding plurality of noise subbands; and (d) for each signal subband: (i) obtaining a power measure of the each signal subband, (ii) comparing the power measure of the each signal subband to the power measure of at least one other signal subband, (iii) whenever the power measure of the at least one other signal subband exceeds the power measure of the each signal subband by a signal masking threshold, nulling the each signal subband, (iv) otherwise, adjusting the each signal subband so that the each signal subband masks a corresponding noise subband.

According to the present invention there is provided a communications device for enabling a user to alternately receive a received signal in a noisy environment and transmit a transmitted signal, including: (a) a mechanism for estimating the noise, thereby providing an estimated noise; (b) a plurality of signal bandpass filters for decomposing the received signal into a plurality of adjacent signal subbands; (c) for each signal bandpass filter, a corresponding noise bandpass filter, the noise bandpass filters for decomposing the estimated noise into a plurality of adjacent noise subbands corresponding to the signal subbands; (d) a mechanism for obtaining a power measure of each signal subband, for comparing the power measure of the each signal subband to the power measure of at least one other the signal subband, and for nulling the each signal subband whenever the power measure of the at least one other the signal subband exceeds the power measure of the each signal subband by a signal masking threshold; and (e) for each signal subband, a mechanism for adjusting the each signal subband to mask a corresponding noise subband.

The primary intended application of the present invention is to cellular telephony, in which a received electronic signal is amplified to overcome ambient acoustic noise prior to being converted to an acoustic signal. Nevertheless, the scope of the present invention includes all environments in which a received signal is amplified to overcome ambient noise.

According to the present invention, the received signal is delayed, relative to an estimate of the ambient noise, to permit backwards time masking. Then, both the received signal and an estimate of the ambient noise are decomposed into a plurality of subbands that span the frequency spectral range of interest. The amplitude envelopes of the signal subbands are converted into masking functions that incorporate, into their respective subbands, the phenomena of forward time masking and reverse time masking. Each masking function is compared to the masking functions of neighboring subbands. Whenever a masking function is less than a neighboring masking function by at least a predetermined signal masking threshold, that masking function is nulled. Similarly, whenever the power envelope amplitude of a noise subband is below the power envelope amplitude of a neighboring noise subband by at least a predetermined noise masking threshold, that noise subband is nulled. For subbands that have not been nulled, the factor by which the signal subband must be amplified to overcome the corresponding noise subband is determined by dividing the corresponding noise subband power envelope amplitude by a denominator related to the value of the corresponding masking function and taking the square root to convert signal power to signal amplitude. The signal subbands are amplified by these factors and summed to provide the output signal.

Preferably, the denominator is the value of the masking function itself. More preferably, the denominator is the value of the masking function delayed by a delay at least as great as a processing time and at most as great as a sum of the processing time and an estimated maximum round trip travel time.

Preferably, in acoustic applications, the amplified signal subbands are adjusted to compensate for psychoacoustic frequency masking.

In acoustic applications, the output signal is converted to an acoustic signal which, along with the ambient acoustic noise, is part of the total local acoustic field. Therefore, the preferred method of estimating the ambient noise is to produce an environmental signal that reflects the total local acoustic field and to subtract the incoming signal from this environmental signal.

To minimize power consumption, this processing by subbands is initiated only when the incoming signal rises above a power threshold. If the incoming signal is expected to be a speech signal, this processing by subbands is initiated only when the power envelope of the incoming signal also rises at a rate exceeding a rate threshold.

In the application of the present invention to two-way communication devices such as cellular telephones, to ensure that the incoming signal does not overwhelm the user's own speech, the processing by subbands is inhibited while the user is speaking. The user's speech is transformed into a transmitted signal. The rise of the power of the transmitted signal from a negligible value to above a start-of-transmission amplitude threshold, at a rate exceeding a start-of-transmission rate, is presumed to indicate the start of the time period in which the processing by subbands is contraindicated because the user is speaking. The inhibition of the processing by subbands continues for a minimum inhibition time or until the power envelope of the transmitted signal falls below an end-of-transmission amplitude threshold at a rate exceeding an end-of-transmission rate threshold, whichever occurs later. The start-of-transmission amplitude threshold is adjusted adaptively with reference to the ambient noise, as reflected in the environmental signal.

BRIEF DESCRIPTION OF THE DRAWINGS

The invention is herein described by way of example only, with reference to the accompanying drawings, wherein.

DESCRIPTION OF THE PREFERRED EMBODIMENTS

The present invention is of a method and device for adaptively amplifying a signal to overcome ambient noise. Specifically, the present invention can be used to ensure that an incoming signal in a system such as a cellular telephony system is audible to the user.

The principles and operation of adaptive signal amplification according to the present invention may be better understood with reference to the drawings and the accompanying description. In the drawing, the device of the present invention is described in terms of functional blocks. In an analog implementation of the present invention, these blocks generally represent circuits that implement the functionality of their respective blocks. In a digital implementation of the present invention, these blocks generally represent algorithms, for implementing the functionality of their respective blocks, that are executed by one or more general purpose processors, one or more special purpose digital signal processors, or a combination thereof. It will be clear to one skilled in the art from the description below exactly how to implement the functionality of these functional blocks in any given realization of the present invention.

Figure 2A:
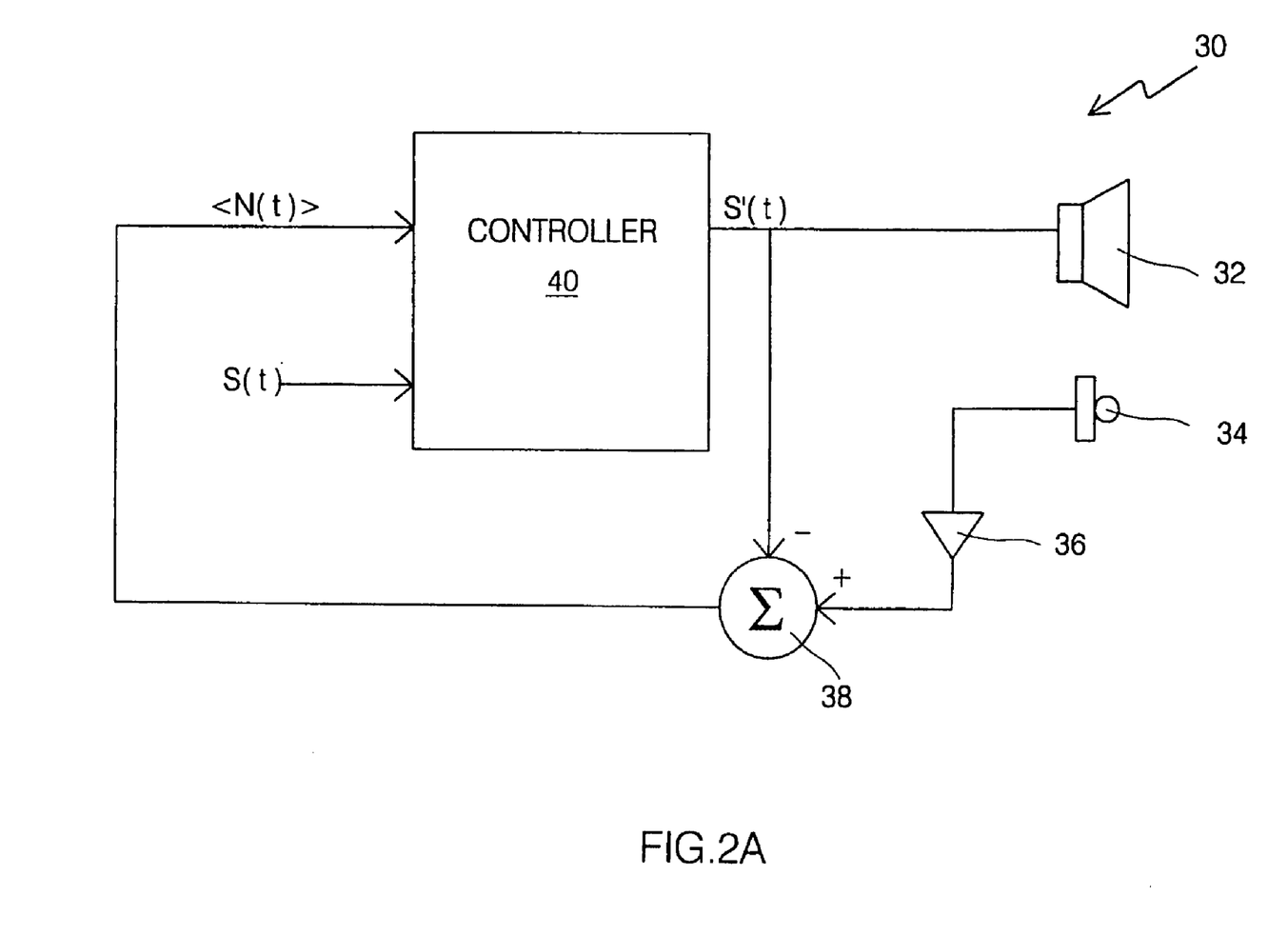
FIG. 2A is a high level block diagram of a device of the present invention.

Referring again to the drawings, FIG. 2A is a high level block diagram of a device 30 of the present invention. The inputs to device 30 are an electronic signal S(t), which is a function of time t, and an external acoustic field, via a microphone 34. The output of device 30 is an acoustic representation of a modified signal S'(t), via a loudspeaker 32. Microphone 34 is representative of a transducer for converting acoustic energy to electrical energy. Loudspeaker 32 is representative of a transducer for converting electrical energy into acoustic energy.

Loudspeaker 32 is sufficiently close to microphone 34 that the acoustic field perceived by the user of device 30, including acoustic energy from loudspeaker 32, is substantially identical to the acoustic field at microphone 34. For example, loudspeaker 32 and microphone 34 may be adjacent in a cellular telephony handset. Therefore, when the user of device 30 is silent, the output of microphone 34 is a sum of the ambient noise near loudspeaker 32 and the rendition of signal S'(t) to acoustic energy by loudspeaker 32. This combined output also is termed herein an "environmental signal". This combined output is amplified in an amplifier 36. Modified signal S'(t) is removed from this amplified output in an error canceler 38 to provide an estimate <N(t)> of the ambient noise near loudspeaker 32. The amplification level of amplifier 36 is adjusted in a calibration procedure so that the signal component of the output of amplifier 36 is substantially equal to modified signal S'(t). The two inputs of controller 40 are signal S(t) and noise estimate <N(t)>. Signal S'(t), the output of controller 40, is signal S(t) modified and amplified relative to noise estimate <N(t)> according to the principles of the present invention to overcome the ambient noise near loudspeaker 32. As will be seen below, the modification imposed on signal S(t) to produce S'(t) includes a time delay dt.

A variant of device 30 includes two microphones 34, one microphone 34 that converts user speech to electrical energy and another microphone 34, located near loudspeaker 32, that converts the acoustic field near loudspeaker 32 to electrical energy. Under this variant, loudspeaker 32 need not be positioned near the user of the device.

Figure 2B:
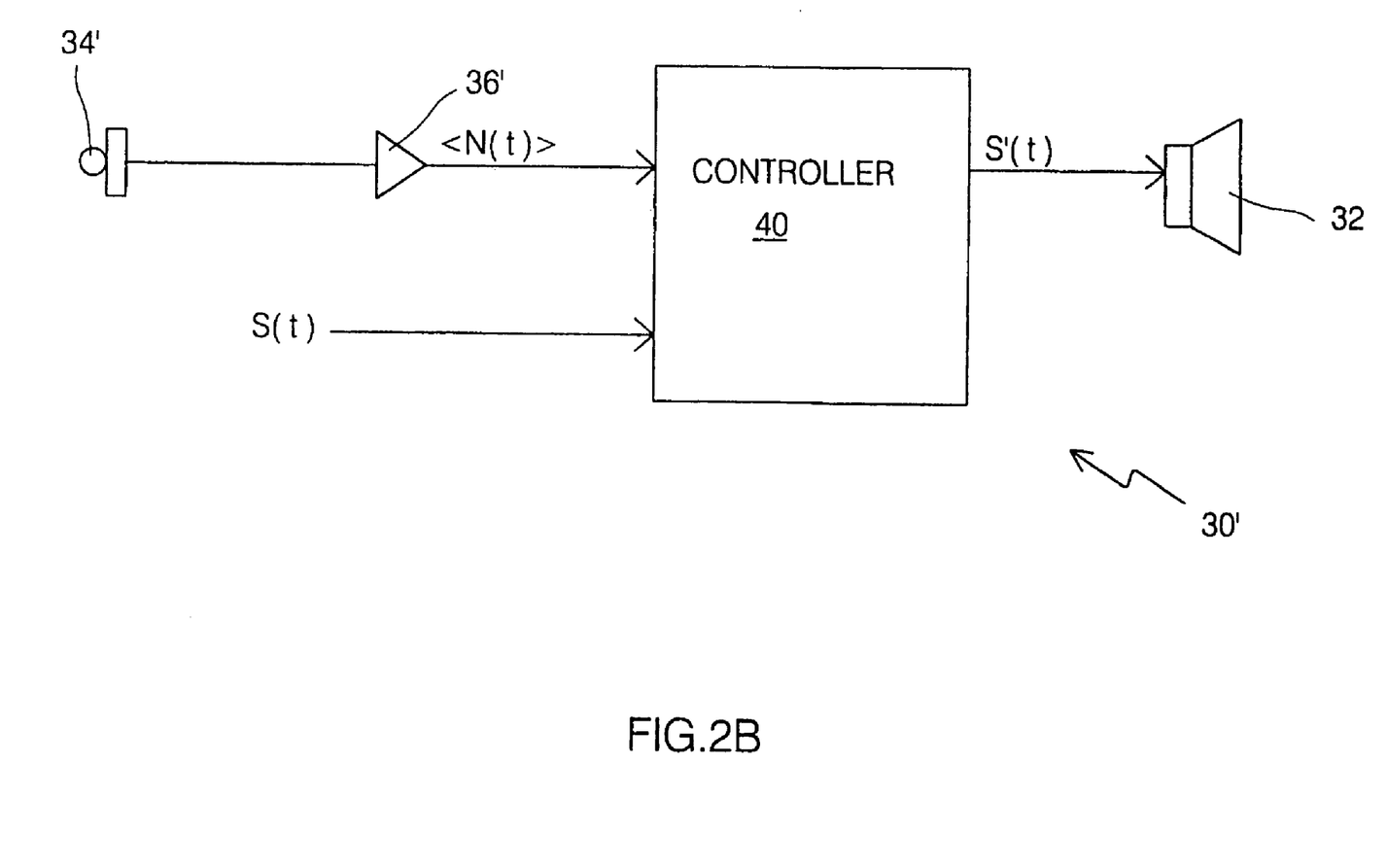
FIG. 2B is a high level block diagram of another device of the present invention.

FIG. 2B is a high level block diagram of a simpler device 30' of the present invention, for use in an environment that includes a single predominant noise source, such as the engine of an automobile. The inputs to device 30' are electronic signal S(t) and the acoustic field near the noise source, via a microphone 34' that is placed near the noise source. As in device 30, the output of device 30' is an acoustic representation of a modified signal S'(t), via loudspeaker 32. The output of microphone 34' is amplified by an amplifier 36' to provide noise estimate <N(t)>. The amplification level of amplifier 36' is adjusted in a calibration procedure so that the amplitude of noise estimate <N(t)> reflects the energy level of the ambient noise at loudspeaker 32.

Figure 3:
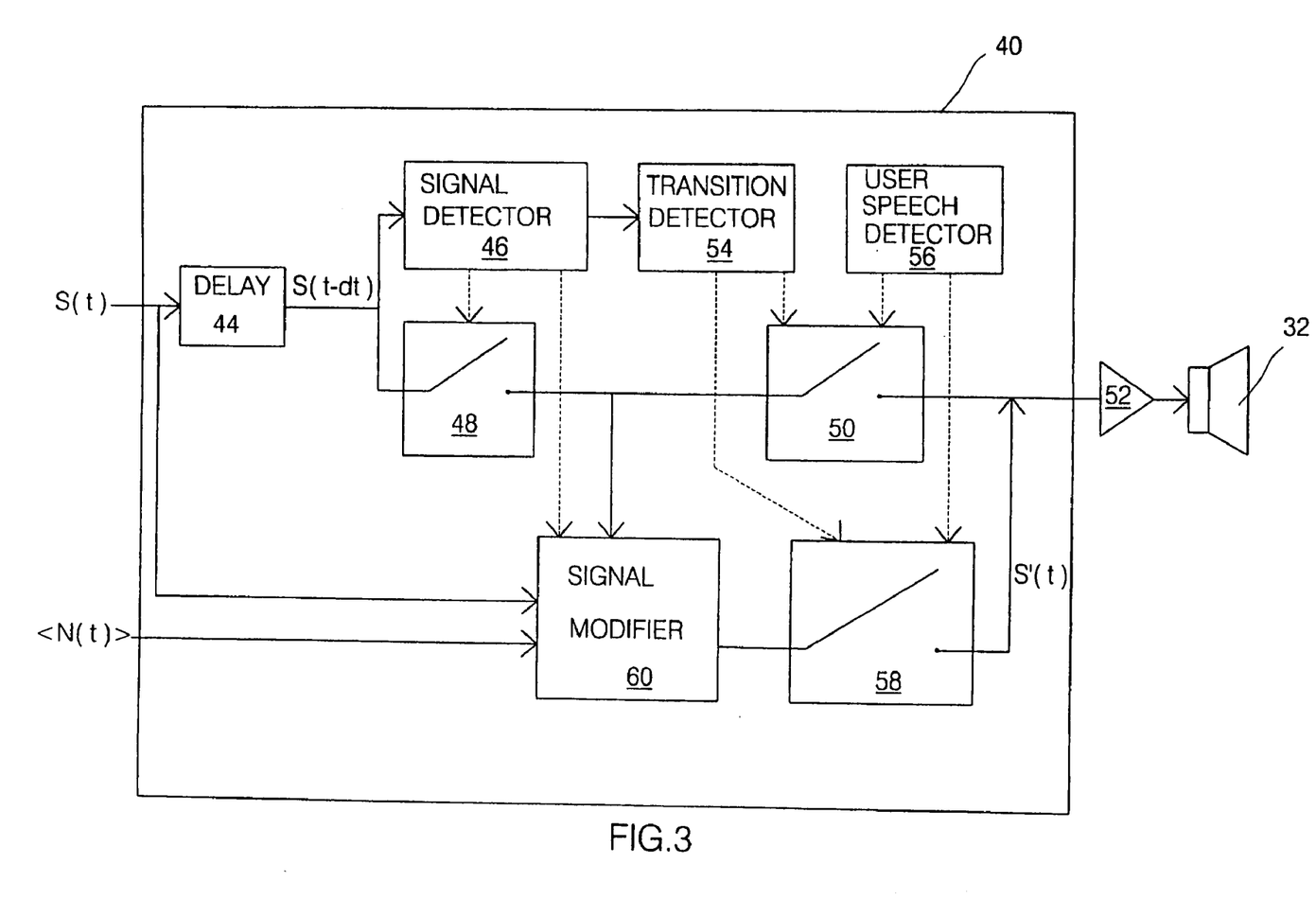
FIG. 3 is a high level block diagram of the controller of the device of FIGS. 2A and 2B.

FIG. 3 is a high level block diagram of controller 40. Solid arrows in FIG. 3 indicate signal flow. Dashed arrows in FIG. 3 indicate control. Signal S(t) is delayed in a delay block 44 by a time delay dt to allow the implementation of processing of signal S(t) based on backward time masking, as described below. The delayed signal S(t−dt) is sent to a signal detector 46 and to a switch 48 that is controlled by signal detector 46. Signal detector 46 keeps switch 48 open until signal detector 46 detects an input signal power level above a certain power threshold. Only when the power of signal S(t) exceeds this threshold does signal detector 46 close switch 48. When switch 48 is closed, delayed signal S(t−dt), along with the undelayed signal S(t) and noise estimate <N(t)>, are input to a signal modifier 60 that further modifies delayed signal S(t−dt) to create modified signal S'(t). The purpose of signal detector 46 is to save power: signal modifier 60, is powered up to create modified signal S'(t) only while a real signal S(t) is received.

The embodiment of controller 40 that is illustrated in FIG. 3 is directed towards receiving signals S(t) that represent speech. Therefore, this embodiment of controller 40 includes a transition detector 54 to implement "wide band masking": at the onset of speech, the rapid increase in signal power causes the corresponding acoustic signal to be perceived by the user despite ambient noise, and the sophisticated processing implemented by signal modifier 60 is not necessary. Transition detector 54 controls two switches 50 and 58. Initially, both switches 50 and 58 are open. When transition detector 54 detects a sufficiently fast increase in signal power, transition detector 54 closes switch 50 and opens switch 58, to allow delayed signal S(t−dt) to be amplified by an amplifier 52 and rendered as audible speech by loudspeaker 32. A typical rate threshold for this action of transition detector 54 is a change of input power of half the full power range of transition detector 54 within 50 milliseconds. When transition detector 54 detects a local maximum in input power, as a function of time, transition detector opens switch 50 and closes switch 58, to allow modified signal S'(t) to be amplified by amplifier 52 and rendered as audible speech by loudspeaker 32. If, with switches 50 and 58 open, signal power increases at a rate lower than the rate threshold, then transition detector 54 merely closes switch 58. When signal power falls below another power threshold, signal detector 46 opens switch 48 and transition detector 54 opens switches 50 and 58.

Controller 40 also includes a user speech detector 56, whose function is to close switch 50 and open 58 while the user is speaking. Thus, while the user is speaking, the user hears unmodified (except for the delay) signal S(t−dt). Absent this functionality of user speech detector 56, the user's speech would be treated by signal modifier 60 as part of the ambient noise field, and modified signal S'(t) would mask both the user's speech and real ambient noise. The operation of user speech detector 56 is described in more detail below.

Figure 4:
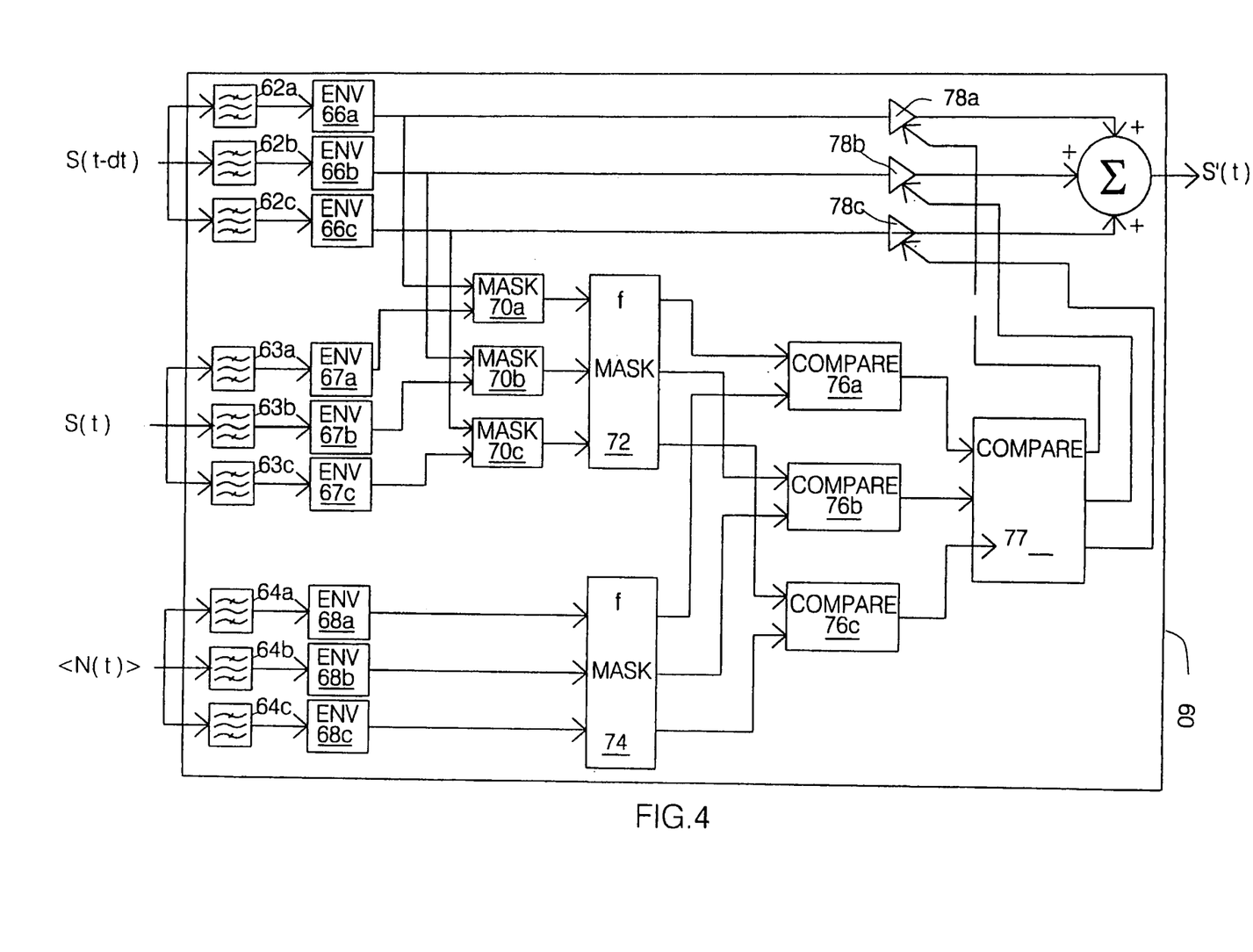
FIG. 4 is a high level block diagram of the signal modifier of the controller of FIG. 3.

FIG. 4 is a high level block diagram of signal modifier 60. The delayed input signal S(t−dt) is directed to a bank of bandpass filters 62. The undelayed input signal S(t) is directed to a similar bank of bandpass filters 63, and the noise estimate <N(t)> is directed to a similar bank of bandpass filters 64. For illustrational clarity, only three delayed signal bandpass filters 62, only three undelayed signal bandpass filters 63 and only three noise bandpass filters 64 are shown in FIG. 4. It is more typical to have 8, 14, 24 or even more bandpass filters 62, 63 or 64 in each bank. The passbands of bandpass filters in the same bank are adjacent, and the passbands of corresponding filters in the two banks are identical. For example, to span the range of audio frequencies, from 20 Hz to 20 KHz, the passband of filters 62a, 63a and 64a could be from 20 Hz to 200 Hz, the passband of filters 62b, 63b and 64b could be from 200 Hz to 2 KHz, and the passband of filters 62c, 63c and 64c could be from 2 KHz to 20 KHz. Note that the frequency spacing in this example is logarithmic, which is preferable to linear spacing. The outputs of delayed signal bandpass filters 62 are delayed signal subbands $S_i(t-dt)$, i∈[1,n], where n is the number of bandpass filters in each bank. The outputs of undelayed signal bandpass filters 63 are corresponding undelayed signal subbands $S_i(t)$. The outputs of noise bandpass filters 64 are corresponding noise subbands $N_i(t)$.

Delayed signal subbands $S_i(t-dt)$ are input to a bank of delayed signal envelope function blocks 66. The output of each delayed signal envelope function block 66i is a delayed signal power envelope function $S^e_i(t-dt)$ that is the power envelope of the delayed input signal subband $S_i(t-dt)$. Similarly, undelayed signal subbands $S_i(t)$ are input to a bank of undelayed signal envelope function blocks 67, and noise subbands $N_i(t)$ are input to a bank of noise envelope function blocks 68. The output of each undelayed signal envelope function block 67i is an undelayed signal power envelope function $S^e_i(t)$ that is the power envelope of the undelayed input signal subband $S_i(t)$. The output of each noise envelope function block 68i is a noise power envelope function $N^e_i(t)$ that is the power envelope of the input noise subband $N_i(t)$. For example, in a digital implementation of the present invention, the samples of the delayed signal power envelope function $S^e_i(t-dt)$ are the squares of the corresponding samples of the delayed signal subbands $S_i(t-dt)$, the samples of the undelayed signal power envelope function $S^e_i(t)$ are the squares of the corresponding samples of the undelayed signal subbands $S_i(t)$, and the samples of the noise power envelope functions $N^e_i(t)$ are the squares of the corresponding samples of the noise subbands $N_i(t)$. Preferably, power envelope functions $S^e_i(t)$, $S^e_i(t-dt)$ and $N^e_i(t)$ are again filtered by additional low pass filters (not shown).

Figure 5A:
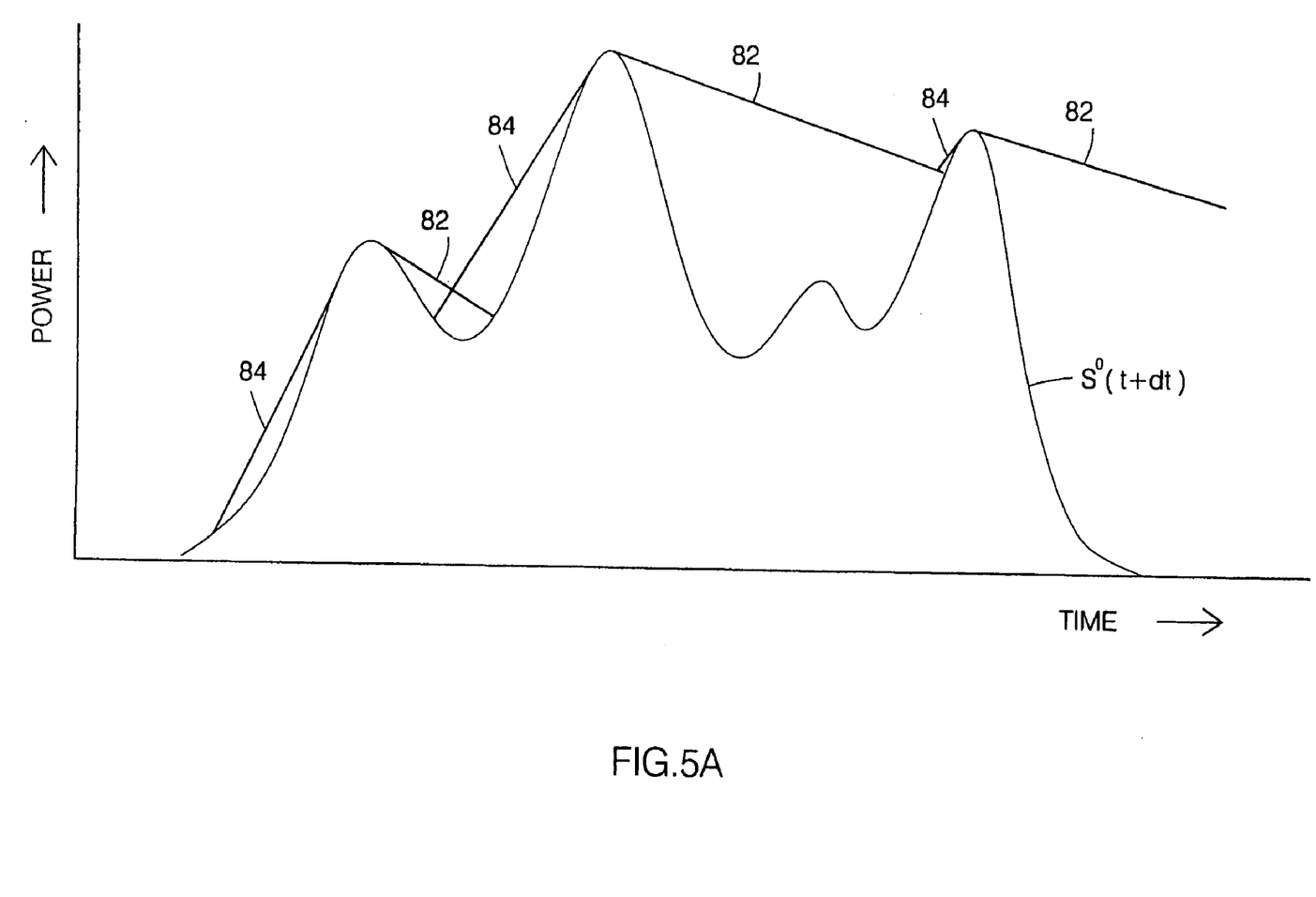
FIG. 5 illustrates the conversion of a signal power envelope to a signal masking function.
Figure 5B:
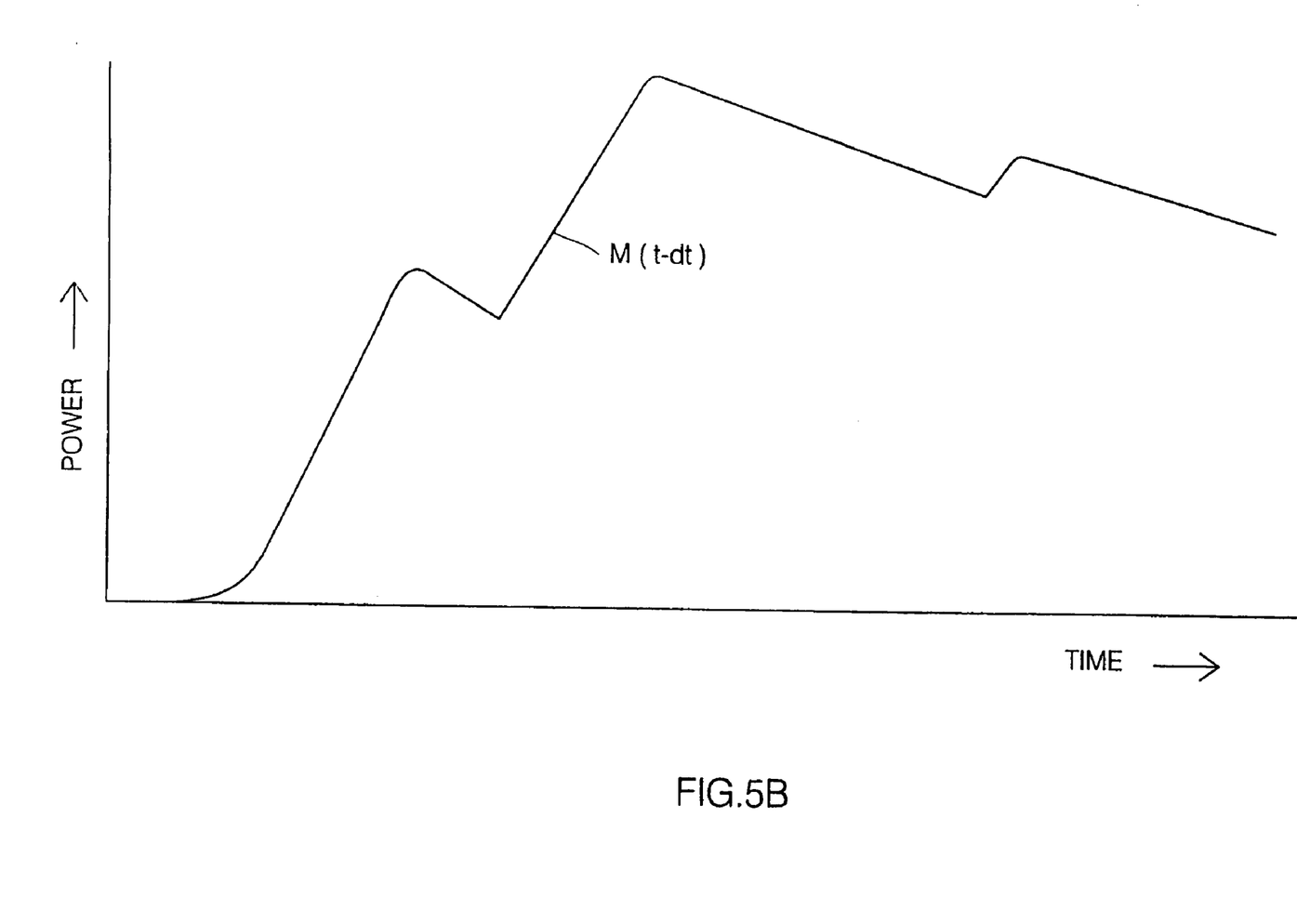

To implement forward and backward time masking, the signal power envelope functions $S^e_i(t-dt)$ are converted to signal masking functions $M_i(t-dt)$ in mask function blocks 70. How this is done is illustrated in FIG. 5. FIG. 5A shows a signal power envelope function $S^e(t-dt)$ as a function of time. A set of forward time masking line segments 82 are applied to the peaks of signal power envelope function $S^e(t-dt)$ as shown. The slopes of forward time masking line segments 82 are shallow and negative, corresponding to forward time masking as described above. A set of backward time masking line segments 84 also are applied to the peaks of the signal power envelope function $S^e(t-dt)$ as shown. The slopes of backward time masking line segments 84 are steep and positive, corresponding to backward time masking as described above. The slopes increase with frequency, and also increase with peak amplitude. Each mask function block 70 includes a tabulated slope vs. peak amplitude function. The combined envelope of signal power envelope function $S^e(t-dt)$ and line segments 82 and 84 is the desired signal masking function M(t−dt), shown in FIG. 5B. In other words, the procedure illustrated in FIG. 5 turns signal power envelope function $S^e(t-dt)$ into the effective power envelope function M(t−dt) that actually is perceived by the user of device 30. The undelayed signal power envelope functions $S^e_i(t)$ are input to mask function blocks 70 to allow mask function blocks 70 to know in advance the times and amplitudes of the peaks of the delayed signal power envelope functions $S^e_i(t-dt)$, and so to know where to put line segments 84 before the corresponding peaks of the delayed signal power envelope functions $S^e_i(t-dt)$ arrive at mask function blocks 70.

Adjacent frequency masking of the signal masking functions $M_i(t-dt)$ is implemented in frequency mask block 72. Each signal masking function $M_i(t-dt)$ is compared, at least to its nearest neighbors, $M_{i+1}(t-dt)$ (for i<n) and $M_{i-1}(t-di)$ (for i>1). If either nearest neighbor $M_{i\pm1}(t-dt)$ exceeds $M_i(t-dt)$ by more than a certain additive threshold, $M_i(t-dt)$ is nulled, i.e., set equal to zero. This threshold is, in general, a function of the frequency bounds of subband i, and may also be a function of $M_i(t-dt)$ itself. For example one preferred set of thresholds is obtained by descending from the center frequency of each bandpass filter 62 to the center frequencies of the adjacent bandpass filters 62 at a slope of −20 dB/decade. Optionally, non-nearest neighbors $M_{i\pm2}(t-dt)$, $M_{i\pm3}(t-dt)$, etc. may be included in this adjacent frequency masking, with thresholds that are correspondingly higher than the thresholds used for the nearest neighbors $M_{i\pm1}(t-dt)$, although it is most preferred to use only nearest neighbors. In an analog implementation of the present invention, in which the signal masking functions $M_i(t-dt)$ are continuous functions of time, this comparison is done "instantaneously". In a digital implementation of the present invention, in which the signal masking functions $M_i(t-dt)$ are sampled at discrete sampling times $t_j$, this comparison is done separately at each sampling time.

Similar adjacent frequency masking of the noise power envelopes $N^e_i(t)$ is implemented in frequency masking block 74. The thresholds used for frequency masking of the signal masking functions ("signal frequency masking") are not necessarily the same as the thresholds used for frequency masking of the noise power envelopes ("noise frequency masking").

The surviving signal masking functions and noise power envelopes are compared, subband by subband, in comparison blocks 76, to determine, for amplifiers 78, the amplification factors by which the corresponding delayed signal subbands must be amplified to mask the corresponding noise subbands. Most simply, the amplification factor is, for a signal subband that has lower power than the corresponding noise subband, the square root of the ratio of the noise power envelope to the signal masking function: the amplification factor of amplifier 78i at time t is $\max(1, \sqrt{N^e_i(t)/M_i(t-dt)})$. The amplified signal subbands are summed in an adder 80 to give the output modified signal S'(t).

The algorithm described above assumes that controller 40 can effect instantaneous processing of signal S(t) and noise estimate <N(t)>. In fact, this processing takes a finite time $t_p$ which may be as long as about 5 milliseconds. As a result, the amplification factor $\sqrt{N^e_i(t)/M_i(t-dt)}$ lags behind the noise actually heard by the user by at least a delay time of $t_p$.

In some devices 30 of the present invention, loudspeaker 32 and microphone 34 are not adjacent to the user. One example of such a device 30 is an automotive stereo system with loudspeaker 32 and microphone 34 positioned towards the back of the passenger compartment of an automobile. In such an environment, noise from a sporadic noise source located near the driver of the automobile (who is the user of device 30) arrives at the user before it arrives at microphone 34, and the amplification factor lags behind the noise actually heard by the user by a delay time greater than $t_p$.

To compensate for this, it is preferable to use, in the denominator under the square root of the amplification factor, not $M_i(t-dt)$, but, at each time t, the minimum of a set of n+1 delayed signal masking functions $M_i(t-dt-t_p)$, $M_i(t-dt-t_p-t_{max}/n)$, $M_i(t-dt-t_p-2t_{max}/n)$, ..., $M_i(t-dt-t_p-t_{max})$, where $t_{max}$ is twice the estimated maximum lag between the arrival of the noise at the user and the arrival of the noise at microphone 34. Note that $t_{max}$ must be twice the estimated maximum lag to account for both the acoustic travel time from the noise source to microphone 34 and the acoustic travel time from loudspeaker 32 to the user. For this reason, $t_{max}$ also is referred to herein as "an estimated maximum round trip travel time". In the automotive environment described above, the maximum one way acoustic travel time is on the order of 10 milliseconds. With a processing time $t_p$ of 5 milliseconds, the maximum additional delay tp+$t_{max}$ of the delayed signal masking functions is 25 milliseconds.

Most preferably, this compensation is done only for portions of $M_i(t-dt)$ that correspond to backward time masking line segments 84, because it is these portions of $M_i(t-dt)$ that participate in backward time masking.

In addition, it is preferable to make one final adjustment to the amplitudes of the surviving delayed signal subbands, prior to the addition of these subbands in adder 80. For this reason. FIG. 4 shows another comparison block 77 interposed between comparison blocks 76 and adder 80. The preceding adjustment of the amplitude of a signal subband, to overcome the corresponding noise subband, may make that signal subband so loud that psychoacoustic frequency masking by the user renders the adjacent signal subbands inaudible. Therefore, the amplitudes of adjacent surviving signal subbands are compared, in comparison block 77, and relatively weak signal subbands are amplified accordingly.

Figure 6:
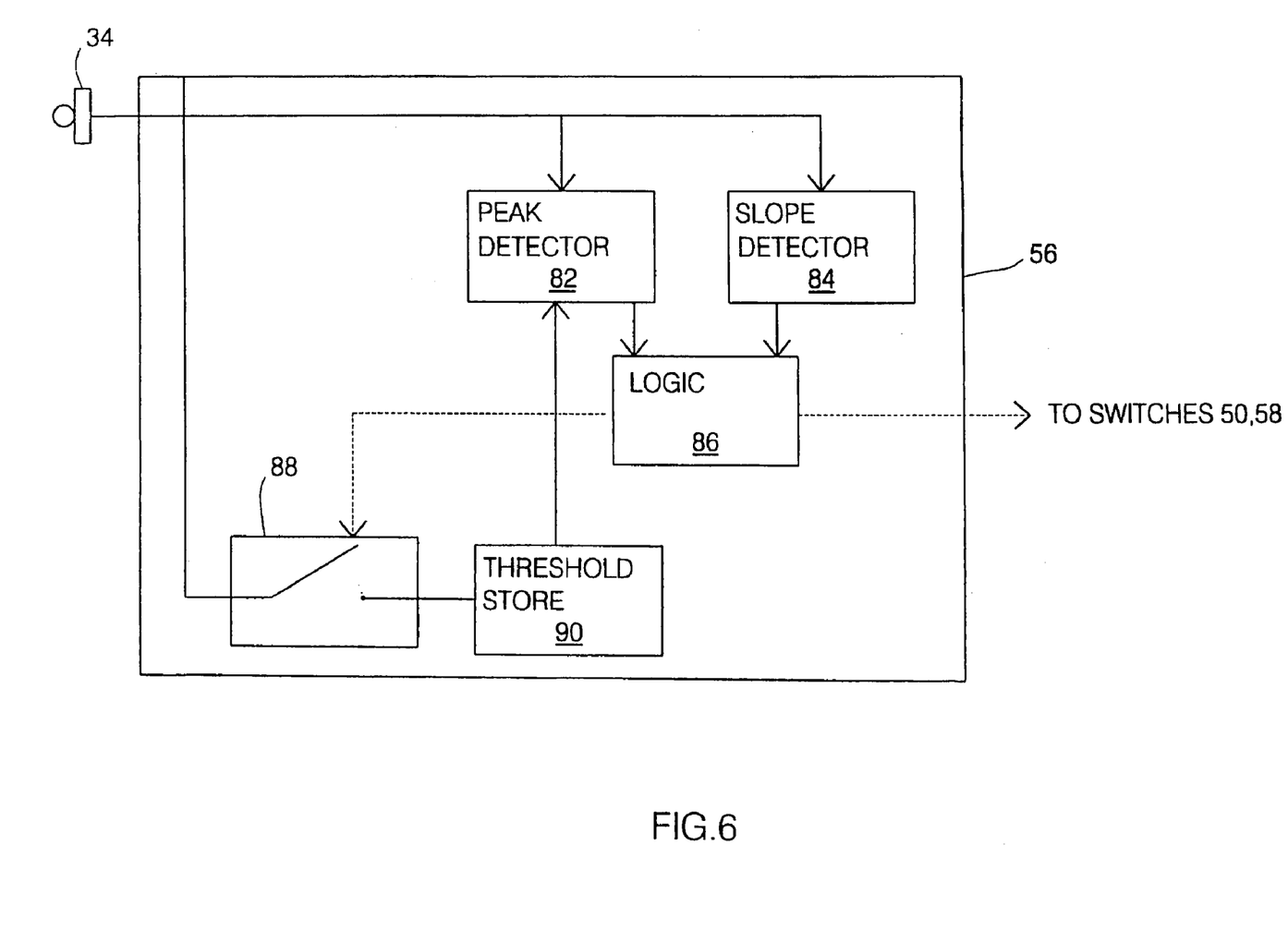
FIG. 6 is a high level block diagram of the user speech detector of the controller of FIG. 3.

FIG. 6 is a high level block diagram of one embodiment of user speech detector 56. As in FIG. 3, solid arrows in FIG. 6 indicate signal flow and dashed arrows in FIG. 6 indicate control. In addition to being transmitted to the party with whom the user wishes to converse, the signal (optionally amplified) from microphone 34 is input into a peak detector 82 and a slope detector 84. Similar to signal detector 46, peak detector 82 detects the rise of the input signal power above a threshold that is determined adaptively as described below. Similar to transition detector 54, slope detector detects the rise of the input signal power at a rate exceeding a preset threshold. When both conditions obtain, i.e. that the signal power from microphone 34 is increasing at a rate exceeding the preset rate threshold and has risen above the adaptively set signal threshold, logic block 86 concludes that user speech has begun. Logic block 86 then closes switch 50 of controller 40 and opens switch 58 of controller 40, as described above. Note that peak detector 82 is only one of several types of signal-onset detectors that are known in the art and that are suitable for detecting the onset of a signal from microphone 34.

When the user's speech pauses, peak detector 82 detects the fall of the input signal power below the signal threshold and slope detector detects the fall of the input signal power at a rate exceeding the preset threshold. When both conditions obtain, i.e., that the signal power from microphone 34 is decreasing at a rate exceeding the preset threshold and has fallen below the adaptively set signal threshold, and if a preset time has elapsed since the beginning of user speech, logic block 86 concludes that user speech has ended. Logic block 86 then opens switch 50 of controller 40 and closes switch 58 of controller 40.

The adaptive threshold for peak detector 82 is provided by a threshold store 90 that averages and stores the signal from microphone 34 while the user is not speaking and the signal from microphone 34 therefore represents ambient noise. To that end, logic block 86 also opens a switch 88 along with switch 58 when logic block 86 detects the onset of user speech, and logic block 86 closes switch 88 along with switch 58 when logic block detects the end of user speech.

While the invention has been described with respect to a limited number of embodiments, it will be appreciated that many variations, modifications and other applications of the invention may be made.

What is claimed is:

1. A method of boosting an input signal to overcome a noise, comprising:
    (a) estimating the noise, thereby providing an estimated noise;
    (b) bandpassing the input signal in a plurality of pass bands to obtain a corresponding plurality of signal subbands;
    (c) bandpassing the estimated noise in said plurality of pass bands to obtain a corresponding plurality of noise subbands; and
    (d) for each said signal subband:
        (i) obtaining a power measure of said each signal subband,
        (ii) comparing said power measure of said each signal subband, to said power measure of at least one other signal subband, and
        (iii) whenever
            said power measure of said at least one other signal subband exceeds said power measure of said each signal subband by a signal masking threshold,
            nulling said each signal subband,
        otherwise,
            adjusting said each signal subband so that said each signal subband masks a corresponding said noise subband.

2. The method of claim 1, further comprising the step of:
    (e) delaying the input signal, prior to said bandpassing.

3. The method of claim 1, further comprising the step of:
    (e) summing said adjusted signal subbands to provide an output signal.

4. The method of claim 3, further comprising the step of:
    (f) prior to said summing of said adjusted signal subbands, further adjusting said adjusted signal subbands to compensate for psychoacoustic frequency masking.

5. The method of claim 1, further comprising:
    (e) for each said noise subband:
        (i) comparing a power of said each noise subband to said power of at least one other noise subband, and
        (ii) whenever said power of said at least one other noise subband exceeds said power of said each noise subband by a noise masking threshold, ignoring the masked noise subband in further processing.

6. The method of claim 1, wherein said at least one other signal subband, whereto said each signal subband is compared, is a neighboring said signal subband.

7. The method of claim 1, wherein said estimating of the noise is effected by steps including:
(i) measuring an environmental signal; and
(ii) removing said input signal from said environmental signal.

8. The method of claim 7, wherein said removing is effected using an error canceler.

9. The method of claim 1, further comprising the step of:
(e) measuring a power of the input signal;
said bandpassing of the input signal being contingent on said power of the input signal increasing from a negligible value to at least a power threshold.

10. The method of claim 9, further comprising the step of:
(f) measuring a rate of change of said power of the input signal;
said bandpassing of the input signal being further contingent on said rate of change of said power of the input signal exceeding a rate threshold.

11. The method of claim 1, wherein said power measure of said signal subband is a masking function.

12. The method of claim 11, wherein said masking function is obtained by adjusting said signal subband for both forward masking and backward masking.

13. The method of claim 11, wherein said adjusting of said each signal subband is effected by amplifying said each signal subband by a square root of a ratio of a power of said corresponding noise subband to a denominator related to said masking function.

14. The method of claim 13, wherein said denominator is a value of said masking function.

15. The method of claim 13, wherein said denominator is a value of said masking function delayed by a delay at least as great as a processing time.

16. The method of claim 13, wherein said denominator is a value of said masking function delayed by a delay that is at most as great as a sum of a processing time and an estimated maximum round trip travel time.

17. The method of claim 1, further comprising:
(e) detecting an onset of a transmitted signal, from a user that alternately receives the input signal and provides the transmitted signal; and
(f) upon detection of said onset, inhibiting said bandpassing of the input signal.

18. The method of claim 17, wherein said inhibiting is continued for at least a minimum inhibition time.

19. The method of claim 17, wherein said inhibiting is continued until a power of the transmitted signal decreases below an end-of-transmission power threshold at a rate exceeding an end-of-transmission rate threshold.

20. The method of claim 1, wherein bandpassing the input signal in a plurality of pass bands comprises bandpassing into a plurality of adjacent subbands.

21. An apparatus for converting an input signal to an output signal that is distinguishable from a noise, comprising:
a noise estimator;
a plurality of signal bandpass filters configured to decompose the input signal into a plurality of signal subbands;
a plurality of noise bandpass filters configured to decompose estimated noise from the noise estimator into a plurality of noise subbands corresponding to said signal subbands;
a mechanism for obtaining a power measure of signal subbands from the signal bandpass filters,
a comparator adapted to compare the power measure of said each signal subband to said power measure of at least one other said signal subband;
a nullifier adapted to nullify signal subbands when their power measure is exceeded by the power measure of one other signal subband to which they were compared at least by a signal masking threshold; and
circuitry adapted to adjust at least one signal subband to mask a corresponding noise subband.

22. The apparatus of claim 21, further comprising:
a mechanism for delaying the input signal, prior to said decomposing of the input signal into said plurality of signal subbands.

23. The apparatus of claim 21, further comprising a mechanism for summing said adjusted signal subbands to provide an output signal.

24. The apparatus of claim 21, further comprising:
a mechanism for further adjusting said signal subbands to compensate for psychoacoustic frequency masking.

25. The apparatus of claim 21, further comprising:
a mechanism for obtaining a power of each said noise subband, for comparing said power of said each noise subband to said power of at least one other said noise subband, and for ignoring in further processing of said each noise subband whenever said power of said at least one other said noise subband exceeds said power of said each noise subband by a noise masking threshold.

26. The apparatus of claim 21, further comprising a trigger for directing the input signal to said signal bandpass filters after a power of the input signal increases from a negligible value to at least a power threshold.

27. The apparatus of claim 21, further comprising:
a transmission detector adapted to detect onset of signal transmission and an inhibitor configured to block the received signal from said signal bandpass filters upon detection of an onset of transmission.

28. The apparatus of claim 27, wherein said onset is indicated by an increase of a power of the transmitted signal from a negligible value to at least a start-of-transmission power threshold at a rate exceeding a start-of-transmission rate threshold.

29. The apparatus of claim 28, further comprising a mechanism for adapting said start-of-transmission power threshold to the noise.

30. The apparatus of claim 21, further comprising:
a mechanism for delaying the input signal, prior to said decomposing of the received signal into said plurality of signal subbands.

31. The apparatus of claim 21, further comprising a mechanism for summing said adjusted signal subbands to provide an output signal.

32. The apparatus of claim 31, further comprising a mechanism for substituting the input signal for said output signal while a power of the input signal increases at a rate exceeding a rate threshold.

33. In a communications system wherein a user alternately receives a received signal in a noisy environment and transmits a transmitted signal, a method for boosting the received signal to overcome the noise, comprising:
(a) estimating the noise, thereby providing an estimated noise;
(b) bandpassing the received signal in a plurality of adjacent pass bands to obtain a corresponding plurality of signal subbands;
(c) bandpassing the estimated noise in said plurality of adjacent pass bands to obtain a corresponding plurality of noise subbands;

(d) for each said signal subband:
  (i) obtaining a power measure of said each signal subband,
  (ii) comparing said power measure of said each signal subband to said power measure of at least one other signal subband, and
  (iii) whenever
    said power measure of said at least one other signal subband exceeds said power measure of said each signal subband by a signal masking threshold, nulling said each signal subband,
  otherwise,
    adjusting said each signal subband so that said each signal subband masks a corresponding said noise subband,
(e) detecting an onset of the transmitted signal; and
(f) upon detection of said onset, inhibiting said bandpassing of the received signal,
  wherein said inhibiting is continued until said power of the signal decreases below an end-of-transmission power threshold at a rate exceeding an end-of-transmission rate threshold.

34. The method of claim 33, wherein said detecting of said onset is effected by measuring a power of the transmitted signal, said onset being deemed to have occurred if said power of the transmitted signal increases from a negligible value to at least a start-of-transmission power threshold at a rate exceeding a start-of-transmission rate threshold.

35. The method of claim 34, wherein said start-of-transmission power threshold is relative to the noise.

* * * * *